United States Patent [19]
Gyngell et al.

[11] Patent Number: 4,703,268
[45] Date of Patent: Oct. 27, 1987

[54] CLEAN MULTIPLE ECHO MAGNETIC RESONANCE IMAGING USING ASYMMETRIC SEQUENCES

[75] Inventors: Michael L. Gyngell, Berkhamsted; Graham L. Nayler, Abingdon, both of United Kingdom

[73] Assignee: Picker International, Ltd., Highland Hts., Ohio

[21] Appl. No.: 835,467

[22] Filed: Mar. 3, 1986

[51] Int. Cl.$^4$ ............................................. G01R 33/20
[52] U.S. Cl. ..................................... 324/309; 324/307
[58] Field of Search ............... 324/307, 309, 310, 312, 324/311, 318

[56] References Cited

U.S. PATENT DOCUMENTS 4,297,637 10/1981 Crooks et al. ....................... 324/309

OTHER PUBLICATIONS

"Spin Echoes" E. L. Hahn, *Physical Review*, vol. 80, No. 4, Nov. 15, 1950, pp. 580-594.
"Effects of Diffusion on Free Precession in Nuclear Magnetic Resonance Experiments" H. Y. Carr and E. M. Purcell; *Physical Review*, vol. 94, No. 3, May 1, 1954, pp. 630-638.
"Effects of Diffusion in Nuclear Magnetic Resonance Spin-Echo Experiments", D. E. Woessner Journal of Chemical Physics, vol. 34, No. 6, Jun. 1961, pp. 2057-2061.
"Diffusion and Field Gradient Effects in NMR Fourier Spectroscopy", R. Kaiser, E. Bartholdi, and R. R. Ernst, Journal of Chemical Physics, vol. 60, No. 8, Apr. 1974, pp. 2966-2979.

*Primary Examiner*—Stewart J. Levy
*Assistant Examiner*—Kevin D. O'Shea
*Attorney, Agent, or Firm*—Fay, Sharpe, Beall Fagan, Minnich & McKee

[57] ABSTRACT

A multi-pulse radio frequency signal sequence includes a 90° excitation pulse (50) and at least a first 180° refocusing pulse (52) and a second 180° refocusing pulse (54). The excitation pulse and first refocusing pulse are separated by a duration A and the first and second refocusing pulses are separated by A+B. A free induction decay (60) follows the excitation pulse, a first spin echo (62) occurs a duration A after the first refocusing pulse and a second spin echo (64) occurs the duration B after the second refocusing pulse. A first read gradient (90) is applied between the excitation and first refocusing pulses; a second read gradient (92) is applied between the first refocusing pulse and the first spin echo; a third read gradient (94) is applied between the first spin echo and the second refocusing pulse; and a fourth read gradient (96) is applied between the second refocusing pulse and the second spin echo. Because the 90° and 180° pulses are imperfect, parasitic echoes occur at durations 3A+B, 3A+2B, and 4A+2B after the 90° excitation pulse. To avoid contamination of the spin echo data by the parasitic echoes, the durations A and B are selected such that the parasitic echoes are each displaced from the spin echoes. To shift the parasitic echoes into times which are non-coincident with the spin echoes, the amplitudes of the read gradients are similarly varied between the spin echoes to shift the parasitic echoes relative to the spin echoes.

21 Claims, 8 Drawing Figures

CLEAN MULTIPLE ECHO MAGNETIC RESONANCE IMAGING USING ASYMMETRIC SEQUENCES

BACKGROUND OF THE INVENTION

The present invention relates to the art of magnetic resonance imaging. The present invention finds particular application in conjunction with Carr-Purcell pulse-echo sequence magnetic resonance techniques and will be described with particular reference thereto. However, it is to be appreciated that the present invention is also applicable to other multiple echo spectroscopy and imaging techniques.

In imaging, a strong magnetic field is applied to orient the magnetization vector of nuclear dipoles to be imaged along the magnetic field, commonly denoted as the z-axis. A conventional spin echo pulse sequence starts with a 90° pulse which rotates the equilibrium magnetization vector 90° from the z-axis into the xy plane. The magnetization vectors of each component rotate in the xy plane at a frequency determined by the gyromagnetic ratio of the corresponding nuclei and the local magnetic field strength. Although the magnetization vectors for the multitude of components all start out coincident or in phase, inhomogenieties in the magnetic field cause the magnetization components to dephase as time progresses.

The application of a theoretically perfect 180° refocusing pulse rotates the vectors 180° about an axis in the x-y plane. This 180° rotation reverses the sign of the accumulated phase angles of rotation of the vector components; further time evolution then causes the components to commence moving back into phase or rephasing. When the refocusing pulse is applied a time t after the 90° pulse, the components are again in phase at a time 2t and produce a spin echo. Thereafter, the magnetization vector components begin dephasing in the opposite direction.

In a Carr-Purcell sequence, 180° refocusing pulses are applied the time t after each spin echo causing another spin echo a time t after each refocusing pulse or 2t after the preceding spin echo. By cyclically applying the refocusing pulses at times $2(n-1)t$, a series of spin echoes at times $2nt$ result, where n is an integer.

Very long echo trains have been employed in nuclear magnetic resonance spectroscopy. However, the timing constraints in whole body magnetic resonance imaging systems commonly only permit the observation of six to eight useful echoes in a multi-slice mode.

When the Carr-Purcell sequence is applied directly to imaging, experimental conditions become non-ideal. Because the imaging fields are applied to extended samples, great reliance is placed on the uniformity of the main magnetic field and the radio frequency or pulse uniformity over the image region. The applied magnetic field gradients may result in a build-up of eddy current gradients which degrade the main field inhomogeneity and cause further imperfections in the rotation angles of the 90° excitation pulse and the 180° refocusing pulses. These imperfections give rise to an additional set of echoes hereinafter termed parasitic echoes. If parasitic echoes occur during data collection, imaging artifacts result. In a conventional Carr-Purcell sequence, the parasitic echoes normally occur coincidentally with the normal spin-echo acquisition and with the 180° refocusing pulse application. These unwanted, parasitic echoes cause severe imaging artifacts and ghost images for data collected during the second and subsequent echoes.

The various strategies which have been adopted to suppress these parasitic echoes are either costly in terms of imaging time or calibration time. One of the techniques employs dephasing the rephasing gradient lobes around each 180° pulse in one or more axes. This method does work but it is complicated to apply and tedious to calibrate.

The present invention contemplates a new and improved method and apparatus which avoids the contamination of data with unwanted parasitic echoes in multiple echo imaging sequences.

SUMMARY OF THE INVENTION

In accordance with a first aspect of the present invention, a method of magnetic resonance imaging is provided. A subject to be imaged is positioned in an imaging region through which a generally uniform main magnetic field and magnetic field gradients are provided. An asymmetric sequence of excitation and refocusing pulses are applied. The sequence includes the application of a radio frequency excitation pulse. A first refocusing pulse is applied a duration A after the excitation pulse such that a first spin echo occurs a duration 2A after the excitation pulse. A second refocusing pulse is applied a duration $2A+B$ after the excitation pulse such that second spin echo occurs a duration $2A+2B$ after the excitation pulse. Of course, imperfections in the homogeneity of the magnetic field and imperfections in the excitation and refocusing pulses will cause parasitic echoes which occur at durations $3A+B$, $3A+2B$, and $4A+2B$ after the excitation pulse. During each of the spin echoes, data is acquired in a preselected data acquisition duration which is not longer than the shorter of durations A and B. The durations A and B are selected such that the duration 2A and the duration $2A+2B$ differ by at least the data acquisition duration from each of the durations $3A+B$, $3A+2B$, and $4A+2B$. In this manner, the data collected for imaging is displaced from the parasitic echoes and is free from the distortion attributable thereto. The collected data is then reconstructed into an image representation.

In accordance with a more limited aspect of the invention, one or more additional refocusing pulses are applied. The third refocusing pulse, for example, is applied at a duration $2A+2B+C$ after the excitation pulse. The duration C is again selected such that the parasitic echoes attributable to all three refocusing pulses are displaced from the spin echoes by at least the data acquisition duration.

In accordance with another aspect of the present invention, a method of magnetic resonance imaging is provided. The subject is positioned in an image region which has a generally uniform magnetic field passing longitudinally therethrough. After the application of a radio frequency excitation pulse, a first read gradient pulse is applied. Thereafter, a first refocusing pulse is applied followed by a second read gradient pulse. A spin echo is generated when the amplitude of the second gradient pulse integrated over its duration equals the amplitude of the first gradient pulse integrated over its duration. The read gradient is continuous during the first spin echo as data is acquired. For simplicity of definition, the continuing gradient after the spin echo is herein called a third read gradient pulse. The third read gradient pulse, although continuous with the second read gradient pulse, may have varying amplitudes and may even be discontinuous prior to the application of a second refocusing pulse. After the second refocusing pulse, a fourth read gradient pulse is applied. A second spin echo occurs when the amplitude of the fourth read gradient pulse integrated over its duration equals the amplitude of the third read gradient pulse integrated over its duration. The read gradient continues to be applied during the spin echo as data is collected. In addition to the desired spin echoes, parasitic echoes occur when the amplitude of the fourth read gradient pulse integrated with the respect to its duration equals one of: (1) the amplitude of the first read gradient pulse integrated over its duration, (2) the sum of the amplitudes of the second and third read gradient pulses integrated over their durations, or (3) the sum of the amplitudes of the first, second, and third read gradient pulses integrated over their durations. The amplitudes and durations of the first, second, third, and fourth read gradient pulses are selected such that (1) the amplitude of the first read gradient pulse integrated over its duration, (2) the sum of the amplitudes of the second and third read gradient pulses integrated over their durations, and (3) the sum of the amplitudes of the first, second, and third read gradient pulses integrated over their durations are each different from the amplitude of the fourth read gradient pulse integrated over its duration. In this manner, the second spin echo is offset in time from the parasitic echoes enabling parasitic echo-free spin echo data to be acquired. The acquired data is reconstructed into an image representation.

In accordance with a more limited aspect of the present invention, the refocusing and gradient pulses are applied such that spin echoes occur at equally spaced intervals, the refocusing pulses bisecting such intervals and the interval between the initial excitation pulse and the first spin echo.

In accordance with an alternative more limited aspect of the invention, at least one refocusing pulse is displaced in time from the center of the interval between adjacent spin echoes to allow a controlled expression of chemical shift differences between chemically distinct material in the subject.

In accordance with another aspect of the present invention, an apparatus is provided for magnetic resonance imaging. A main magnet creates a generally uniform magnetic field longitudinally through an imaging region. Gradient field coils selectively create magnetic field gradients across the image region. A radio frequency pulse means selectively applies an asymmetric pulse sequence which includes at least: (1) the application of an excitation pulse, (2) the application of a first refocusing pulse a duration A after the excitation pulse which induces a first spin echo a duration 2A after the excitation pulse, and (3) the application of a second refocusing pulse a duration 2A+B after the excitation pulse which induces a second spin echo a duration 2A+2B after the excitation pulse. Imperfections in the homogeneity of the main magnetic field and imperfections in the excitation and refocusing pulses inherently causes parasitic echoes which occur at durations 3A+B, 3A+2B, and 4A+2B. The durations A and B are selected such that the durations 2A and 2A+2B differ from the durations 3A+B, 3A+2B, and 4A+2B by at least a preselected data acquisition interval. A radio frequency receiving means receives data during the data acquisition interval surrounding each of the spin echoes. An image reconstruction means reconstructs the collected data into an image representation.

In accordance with another aspect of the present invention, a magnetic resonance imaging apparatus is provided. A main magnet creates a magnetic field passing longitudinally through an image region. A radio frequency pulse applying means selectively applies radio frequency excitation and refocusing pulses. A gradient field applying means selectively applies read magnetic field gradients. The gradient applying means and the radio frequency pulse means selectively apply (1) an excitation pulse, (2) a first read gradient, (3) a first refocusing pulse, (4) a second read gradient, (5) a third read gradient which is a continuous extension of the second read gradient, (6) a second refocusing pulse, and (7) a fourth read gradient which is a mirror image of the third read gradient. A first spin echo occurs when the amplitude of the second read gradient integrated over its duration equals the amplitude of the first gradient integrated over its duration. Similarly, a second spin echo occurs when the amplitude of the fourth read gradient integrated over its duration equals the amplitude of the third read gradient integrated over its duration. Parasitic echoes occur when the amplitude of the fourth read gradient integrated with respect to its duration equals any one of (1) the amplitude of the first read gradient integrated over its duration, (2) the sum of the amplitude of the second and third read gradients integrated over their durations, or (3) the sum of the amplitudes of the first, second, and third read gradients integrated over their durations. The amplitudes and durations of the first, second, third, and fourth read gradients are selected such that the first and second spin echoes occur displaced from the parasitic echoes. A radio frequency receiver acquires data during the second spin echoes which are reconstructed into an image representation by an image reconstructing means.

One advantage of the present invention resides in artifact-free images, even when radio frequency pulses are poorly calibrated.

The creation of parasitic echoes attributable to the use of non-180° rotations at the edge of the slice is avoided.

Yet other advantages of the present invention resides in the reduced gradient profile calibration and in minimum sequence maintenance requirements.

A further advantage of the present invention resides in obtaining artifact-free images without signal averaging.

Still further advantages of the present invention will become apparent to those of ordinary skill in the art upon reading and understanding the following detailed description of the preferred embodiment.

BRIEF DESCRIPTION OF THE DRAWINGS

The invention may take form in various steps and arrangements of steps or in various parts and arrangements of parts. The drawings are only for purposes of illustrating a preferred embodiment and are not to be construed as limiting the invention.

DETAILED DESCRIPTION OF THE PREFERRED EMBODIMENT

Figure 1:
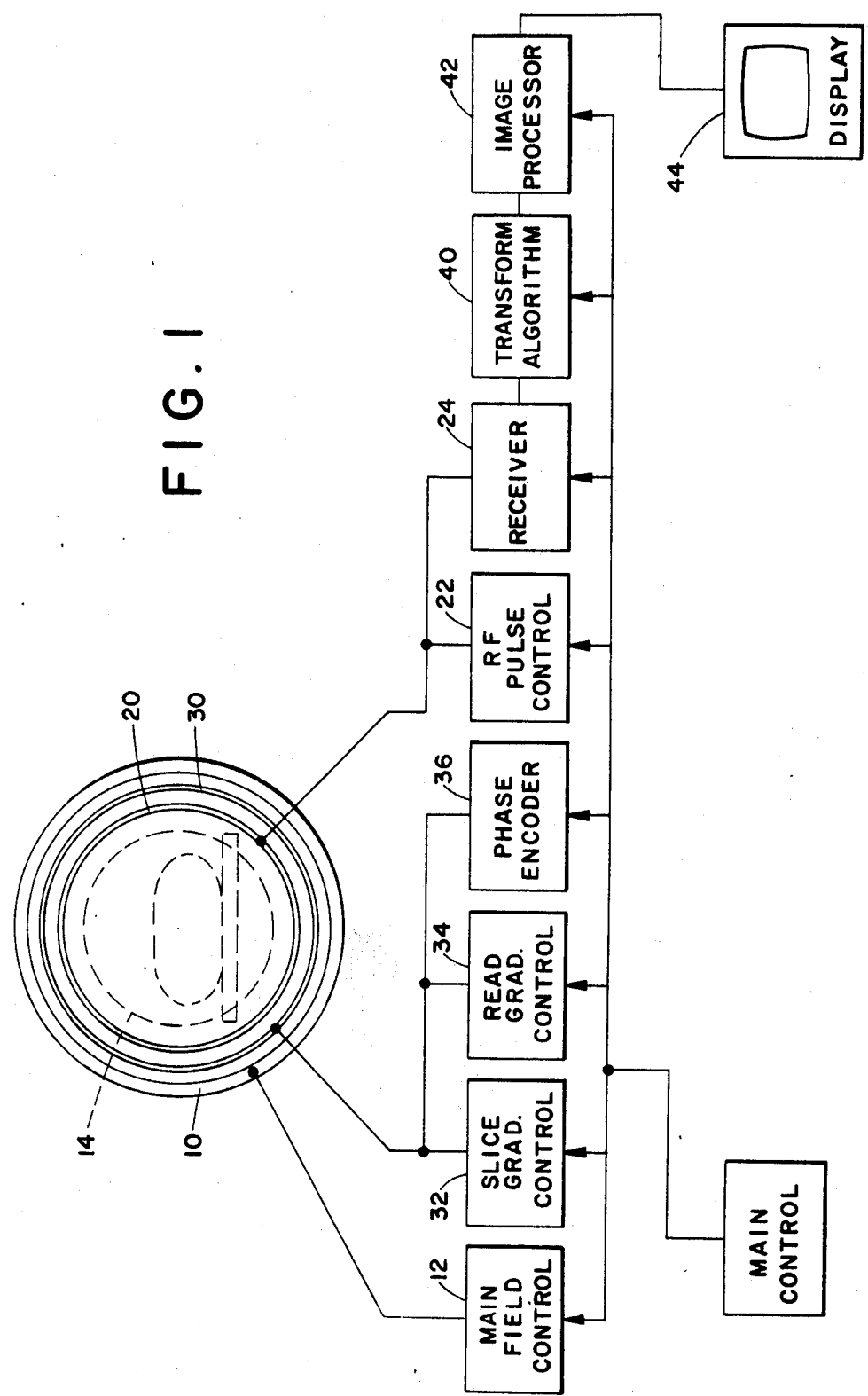
FIG. 1 is a diagrammatic illustration of a magnetic resonance imaging apparatus in accordance with the present invention.

With reference to FIG. 1, a magnetic resonance imaging apparatus includes a plurality of main field magnets 10 and a control circuit 12 therefor that generate a substantially uniform magnetic field linearly through an image region 14. The uniform field causes a preferential alignment of the magnetization of nuclei in the image region. A radio frequency (RF) coil 20 is connected with a radio frequency pulse control circuit or means 22. The radio frequency pulse control circuit selectively causes the RF coil to transmit resonance excitation and refocusing pulses, such as 90° and 180° pulses, in accordance with the sequences and patterns set forth and explained in greater detail below in conjunction with FIGS. 2-6. A radio frequency receiver 24 receives radio frequency resonance signal components generated by the resonating nuclei in the image region. Separate transmit and receiver coils may be provided or the RF coil 20 may may function alternately as a transmitter and as a receiving antenna.

A gradient coil 30 includes the appropriate windings for causing gradients across the main magnetic field in the image region at selectable angles and with selectable durations and periodicities. A slice selection gradient control means or circuit 32 selectively applies electrical power to the gradient coil assembly to select one or more slices or planes in the image region to be examined. Commonly, the slice is selected by applying a linear field gradient across the image region and applying a narrow band excitation pulse to excite spins over a limited range of resonance frequencies. A read gradient control means 34 selectively applies a read gradient across the image region with amplitudes and patterns as described in greater detail below in conjunction with FIGS. 5 and 6. A phase encoder means 36 selectively adjusts the gradients so as to cause a phase shift which varies with spatial position such that the resonance signal is spatially encoded.

A transform means 40 transforms or maps discretely sampled values of the received resonance signals from a phase domain to a spatial domain. In the preferred embodiment, a two dimensional fast Fourier transform algorithm transforms or maps the received resonance signals from each spin echo to generate a corresponding view in the spatial domain. An image processing means 42 processes the views to create an electronic image representation. The image representation may be displayed on a video monitor 44 or other appropriate display or may be stored on disc or tape for further processing, computer evaluation, electronic enhancement, subsequent display, or the like.

Figure 2:
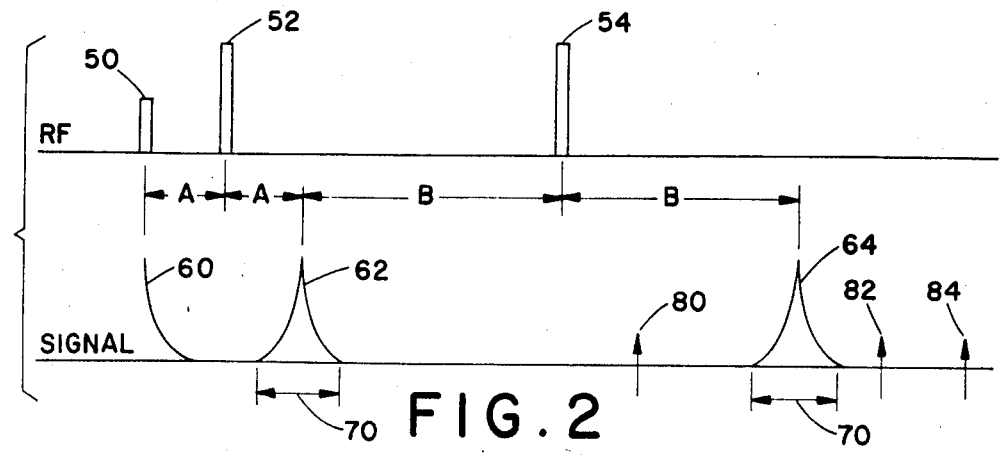
FIG. 2 is a diagrammatic illustration of a asymmetric pulse sequence in accordance with the present invention through the first two refocusing pulses.
Figure 3:
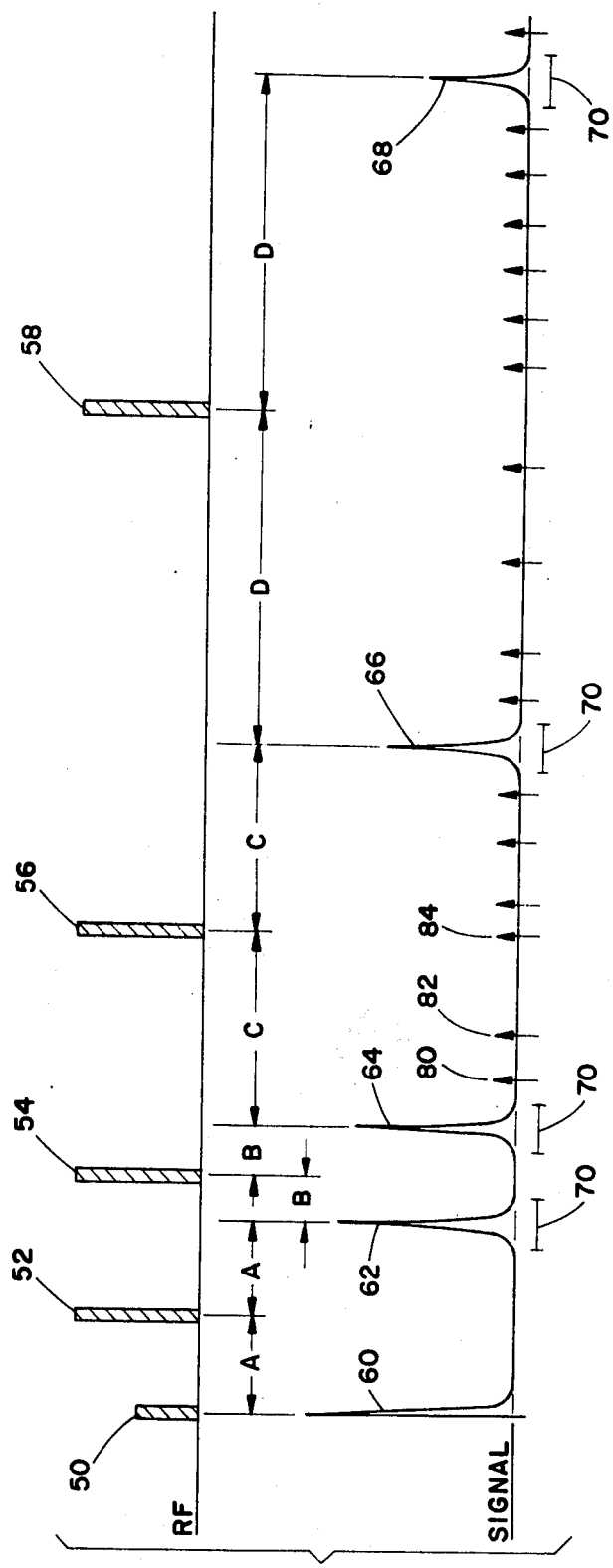
FIG. 3 is an illustration of yet another asymmetric pulse sequence with four spin echoes in accordance with the present invention.

With reference to FIGS. 2 and 3 in a Carr-Purcell sequence, a 90° radio frequency excitation pulse 50 is applied followed by a plurality of 180° refocusing pulses including pulses 52, 54, 56, and 58. The 90° excitation pulse induces free induction decay 60 which quickly dephases. After the first refocusing pulse 52, the magnetization commences rephasing or refocusing in time and produces a first spin echo 62 upon refocusing. After refocusing, the magnetization components commence dephasing. The second refocusing pulse 54 causes the magnetization vector components to start rephasing. When the vectors become refocused, a second spin echo 64 occurs. Additional spin echoes, including third and fourth spin echoes 66 and 68, follow subsequent refocusing pulses. The receiver 24 is actuated during data collection or acquisition windows or intervals 70 which are concurrent with the spin echoes. In the preferred embodiment, the data acquisition windows are of the same preselected duration.

The first refocusing pulse 52 is applied a duration A after the excitation pulse. The first spin echo occurs a duration A after the first refocusing pulse or 2A after the excitation pulse 50. The second refocusing pulse 54 is applied a duration B after the first spin echo or a duration 2A+B after the excitation pulse. The second refocusing pulse is followed by the second spin echo a duration B later, i.e. a duration 2A+2B after the excitation pulse. The third refocusing pulse 56 is applied a duration C after the second spin echo and is followed by the third spin echo 66 a duration C later, i.e. 2A+2B+2C after the excitation pulse. The fourth refocusing pulse 58 is applied a duration D after the third spin echo and is followed by the fourth spin echo 68 a duration D later, i.e. 2A+2B+2C+2D after the excitation pulse. Additional refocusing pulses are likewise followed by additional spin echoes. The data acquisition interval is not longer than the shortest of durations A, B, C and D.

Any radio frequency pulse can be resolved into three components: (1) a 0° component, (2) a 90° component, and (3) a 180° component. A perfect 180° pulse has only a 180° component and no 0° or 90° components. An echo occurs after a 180° rotation or refocusing pulse, provided that there is transverse magnetization in the xy plane beforehand. The 180° inversion may be accomplished with either a single 180° pulse or a pair of 90° pulses separated in time. A pair of separated 90° pulses which are treated as a 180° pulse may have a further 0° or 180° rotation therebetween. After a 180° rotation or inversion, transverse magnetization that was in phase a given duration before the refocusing pulse forms an echo that same duration after the refocusing pulse.

With particular reference to FIG. 2, three parasitic echoes are predicted following the second refocusing pulse. These three parasitic echoes are attributable to a 0° component of a less than perfect 90° excitation pulse 50, the 0° and 90° components of a less than perfect first refocusing pulse 52, and the 90° component of a less than perfect second refocusing pulse 54.

Figure 2A:
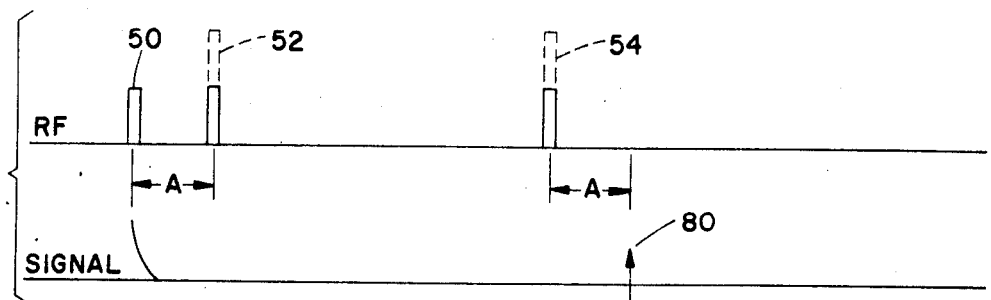
FIGS. 2A, 2B, and 2C illustrate the formation of parasitic echoes attributable to 0° components of the excitation pulse and 0° and 90° components of refocusing pulses of FIG. 2.

With reference first to FIG. 2A, the magnetization vectors which are rotated into the transverse xy plane by the excitation pulse 50 are in part rotated out of the xy plane by the unwanted 90° component of the imperfect 180° first refocusing pulse 52. This rotates the magnetization vectors in part back into the longitudinal or z axis which freezes their dephased state. The magnetization vectors remain 90° out of the transverse plane until the 90° component of the imperfect second refocusing pulse 54 rotates them another 90° back into the xy plane, completing the 180° inversion. The magnetization vector now commences rotating in the xy plane in the opposite direction. The magnetization vectors, having dephased for the duration A before the dephased state was frozen, now require the duration A to come back into alignment forming a first parasitic echo 80 the duration A after the second refocusing pulse, i.e. the duration 3A+B after the excitation pulse.

Figure 2B:
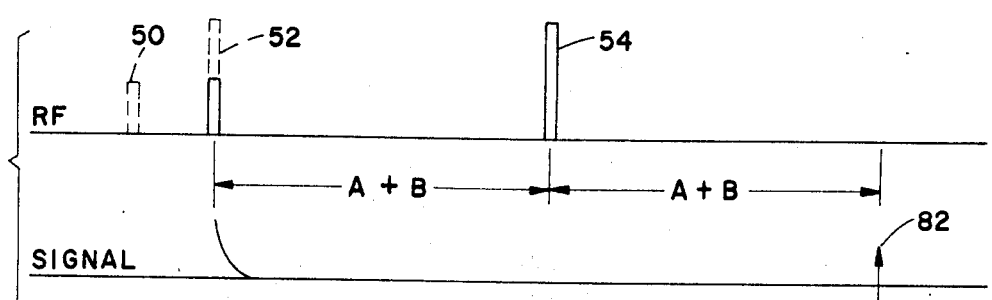

With reference to FIG. 2B, the 0° component of the excitation pulse 50 leaves some magnetization vectors along the z axis. The 90° component of the first refocusing pulse 52 rotates additional magnetization vectors from alignment with the z-axis into the transverse xy plane. Following free induction decay, these magnetization vectors commence dephasing. When the second refocusing pulse 180° is applied the duration A+B later, these vectors commence rephasing, forming a second parasitic echo 82 the duration A+B after the second refocusing pulse, i.e. at a duration 3A+2B after the first excitation pulse 50.

Figure 2C:
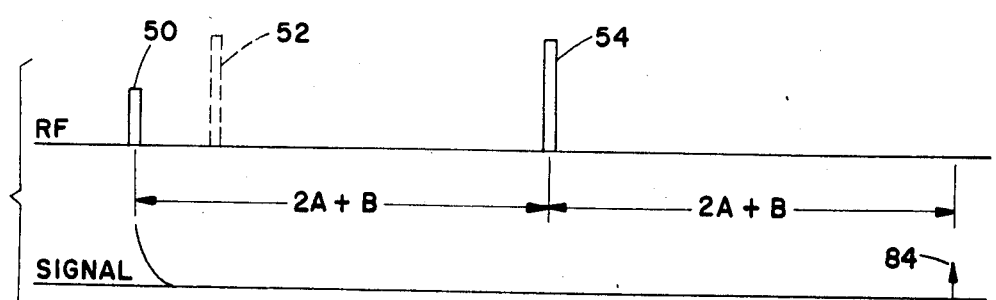

With reference to FIG. 2C, the 0° component of the first refocusing pulse 52 allows a portion of the dephasing magnetization vector components to continue dephasing until the second refocusing pulse is applied. A duration 2A+B later, the second refocusing pulse 54 rotates these magnetization components 180° for the first time. A duration of 2A+B after the second refocusing pulse, these components come back into alignment causing a third parasitic echo 84.

By analogously following the magnetization vectors through the 0°, 90°, and 180° components of these and any additional refocusing pulses, the location of additional parasitic echoes is analogously determined. For example, in FIG. 3, additional parasitic echoes occur at 2A+3B+C, 3A+2B+C, 3A+3B+C, 2A+3B+2C, 4A+3B+C, and so forth. Moreover, each parasitic echo is refocused by subsequent refocusing pulses causing additional parasitic echoes.

It is to be appreciated that in the prior art Carr-Purcell sequence in which durations A, B, C, and D were equal, the first parasitic echo 80 occured concurrently with the second spin echo 62. The second parasitic echo 64 occured concurrently with a third refocusing pulse. The third parasitic echo occured concurrently with the third spin echo. Analogously, additional parasitic echoes occurred concurrently with the later spin echoes and refocusing pulses.

For the spin echoes to be collected cleanly, the durations A and B are selected such that the parasitic echoes occur further from the spin echo than the data acquisition interval 70.

It is to be appreciated that numerous relative times for durations A, B, C, D, etc. may be selected. In the two refocusing pulse sequence illustrated in FIG. 2, the duration A is equal to the data acquisition interval and the duration B is equal to three times duration A. As another example, in a three refocusing pulse sequence, the duration A may equal twice the data acquisition interval, the duration may B equal the data acquisition interval, and duration C may equal four times the data acquisition interval. Other operative configurations include duration A being the same as the data acquisition interval, duration B being three times the data acquisition interval, and duration C being twice the data collection interval. In yet another three refocusing pulse embodiment, duration A is twice the data acquisition interval, duration B is three times the data acquisition interval, and duration C is four times the data acquisition interval. Numerous other ratios between durations A, B, and C may advantageously be employed, including fractional ratios.

In the four echo sequence illustrated in FIG. 3, the duration A is twice the data acquisition interval, the duration B is equal to the data acquisition interval, the duration C is four times the data acquisition interval and duration D is seven times the data acquisition interval. Yet another operative four echo sequence has the duration A equal to the data acquisition interval, the duration B three times duration A, the duration C twice duration A, and duration D six times duration A.

Figure 4:
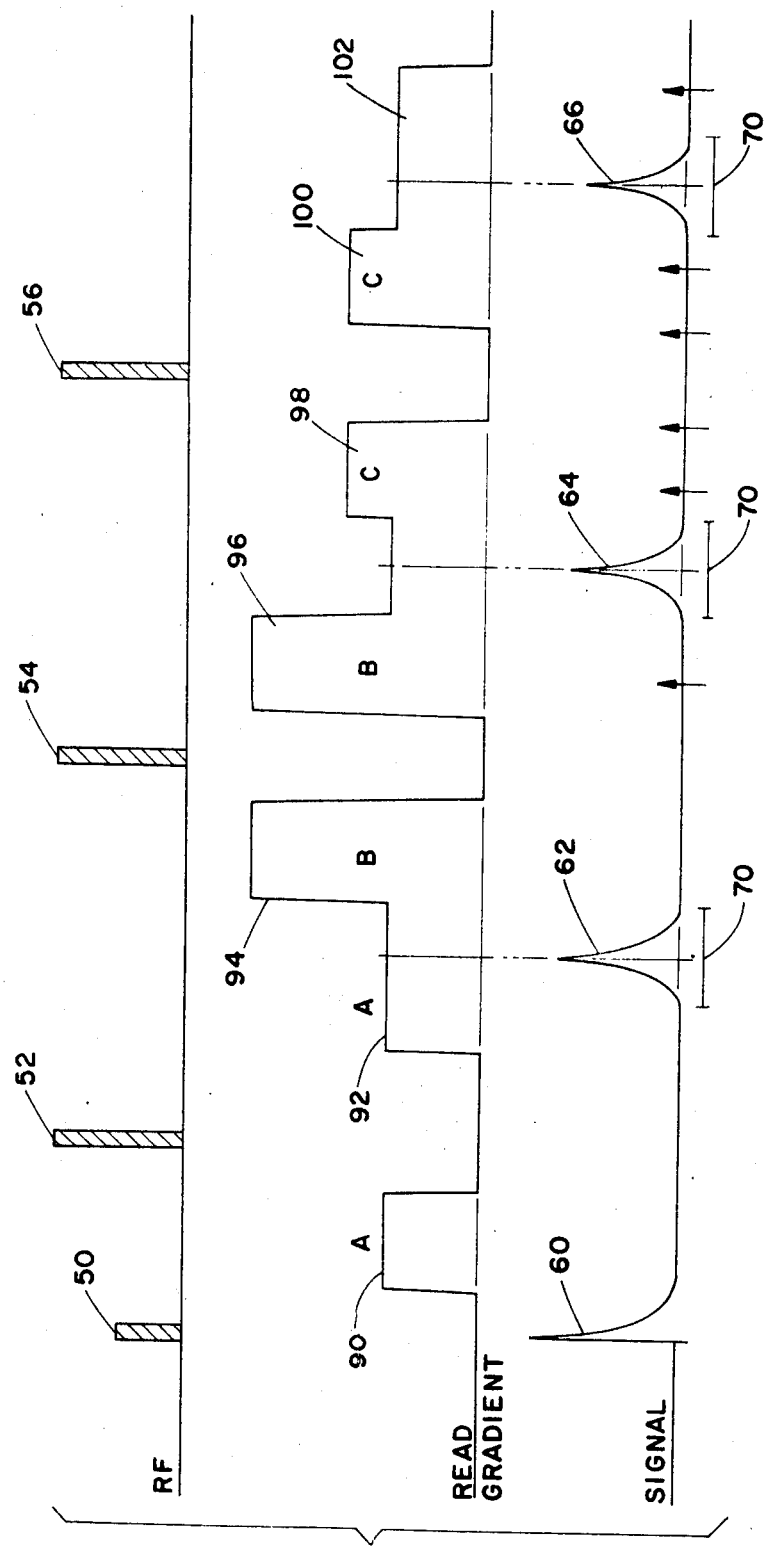
FIG. 4 illustrates an asymmetric pulse sequence in accordance with the present invention in which the read gradients are varied in amplitude to move the spin echoes and the parasitic echoes out of coincidence; and, FIG. 5 is a diagrammatic illustration of another asymmetric pulse sequence in which the read gradients are also asymmetric in accordance with the present invention.

With reference to FIG. 4, an echo occurs at a time when the integrated areas under the gradients on either side of the refocusing pulse are equal. This holds true for both spin echoes and parasitic echoes in multiple echo sequences. That is, the second spin echo 64, for example, occurs when the integrated area of the gradient pulse following the second refocusing pulse 54 equals the integrated area of the gradient between the first spin echo 62 and the second refocusing pulse 54. By manipulating the gradient areas, the parasitic echoes can be moved away from the spin echoes. The manipulation of the area under the gradient can move the parasitic echoes away from the spin echoes while preserving the time symmetry of a conventional Carr-Purcell sequence in which all refocusing pulses are equally spaced. For example, increasing or decreasing the gradient amplitude accelerates or retards the occurance of the forecast echo.

The gradient strength during data acquisition varies with the length of the acquisition window, the data sampling rate, and the requisite field of view. The gradient strength is the same for the acquisition of each spin echo in the train for simplicity of processing the collected data. The actual amplitude or value of the gradient between sampling durations is not significant to the collected data, provided that the gradients areas in each inter-event interval are adhered to. The asymmetric gradient profiles enable the parasitic and spin echoes to be shifted apart, even while implementing a conventional Carr-Purcell symmetric refocusing pulse sequence. By appropriately tailoring the gradient pulses and appropriately positioning the refocusing pulses, the spin echoes and the parasitic echoes can be positioned at convenient times for a pathology to be observed.

With continuing reference to FIG. 4, a first read gradient pulse 90 is applied between the excitation pulse 50 and the first refocusing pulse 52. A second read gradient pulse 92 is applied subsequent to the first refocusing pulse. When the integrated area under the second read gradient pulse 92 equals the amplitude of the first gradient pulse 90 integrated over its duration, the first spin echo 62 occurs. The amplitude of the read gradient is held constant during the data acquisition interval 70. After the first spin echo, a third read gradient pulse 94 is applied. The third read gradient pulse 94 is continuous with the second read gradient pulse 92 and, for purposes of definition herein, is considered to commence at the first spin echo 62.

After the second refocusing pulse 54, a fourth read gradient pulse 96 is applied. When the area under the fourth read gradient pulse is equal to the area under the third read gradient pulse, i.e. when the amplitude of the fourth read gradient integrated with respect to time equals the amplitude of the third read gradient pulse integrated with respect to its duration, the second spin echo 64 occurs. For simplicity in handling the collected data, the amplitude of the read gradient during the second spin echo data acquisition interval is the same as the amplitude of the read gradient during the first spin echo data acquisition interval.

A fifth read gradient 98 follows continuously on the fourth read gradient. By definition, the fourth read gradient ends and the fifth read gradient commences simultaneously with the second spin echo. A sixth read gradient pulse 100 is applied after the third refocusing pulse 56. When the amplitude of the sixth gradient pulse integrated with respect to duration equals the amplitude of the fifth read gradient pulse integrated with respect to its duration, the third spin echo 66 occurs. The read gradient 102 is continued beyond the third spin echo for at least the data acquisition duration 70.

Figure 5:
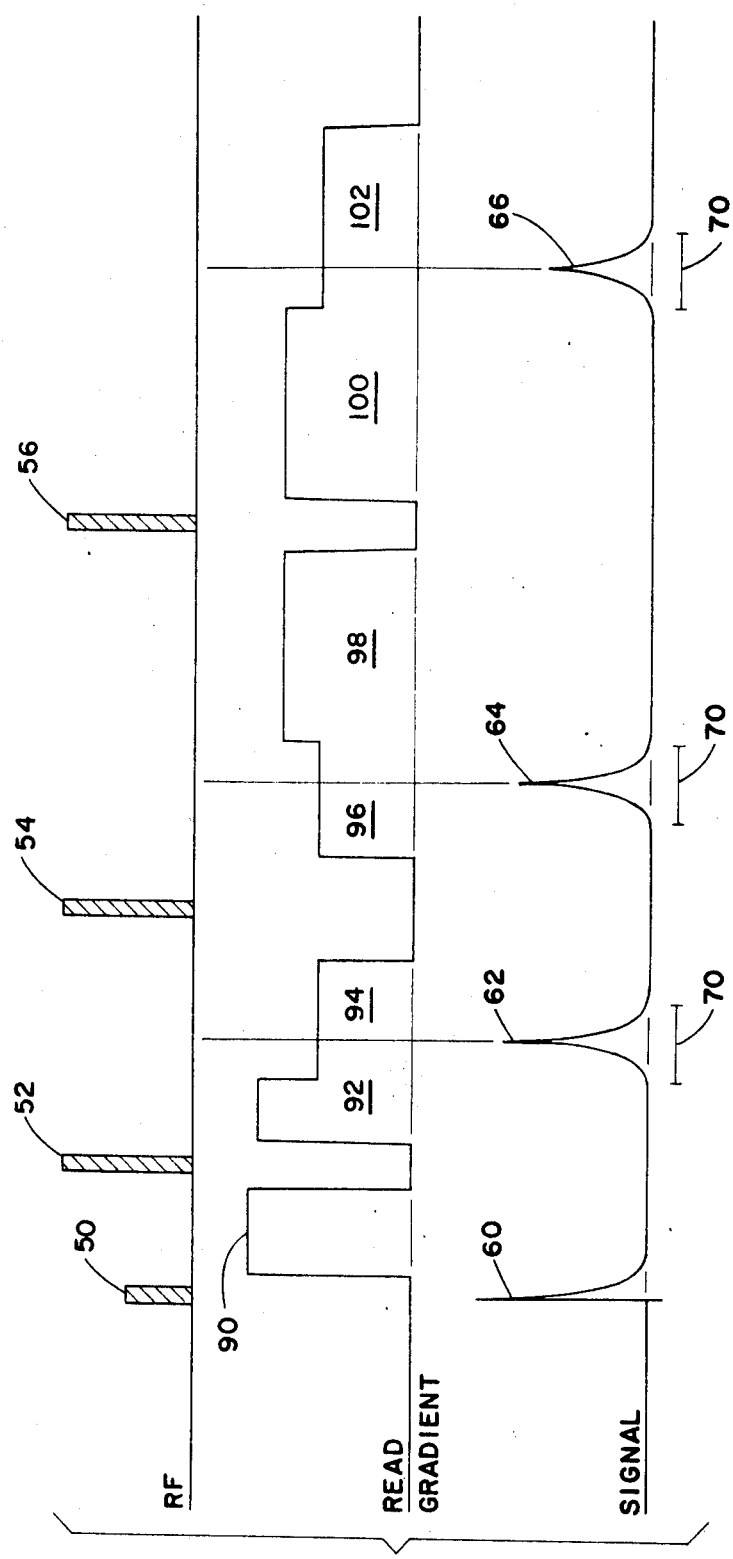

FIG. 5 illustrates an asymmetric read gradient sequence in conjunction with a refocusing pulse sequence with asymmetric timing. The first spin echo 62 again occurs when the amplitude of the second read gradient 92 integrated with respect to time equals the amplitude of the first read gradient 90 integrated with respect to time. The second spin echo 64 occurs when the amplitude of the fourth read gradient 96 integrated with respect to time is equal to the amplitude of the third read gradient 94 integrated with respect to its duration. The third spin echo 66 occurs when the amplitude of the fifth read gradient 100 integrated with respect to time equals the amplitude of the fourth read gradient 98 integrated with respect to its duration. All gradient pulses are held at the same preselected amplitude during the data acquisition interval 70. Optionally, the sequence may be continued for additional inversions, rotations, and other magnetization manipulations.

In the illustrated sequence, each pair of the read gradients are configured symmetrically about the intervening refocusing pulse. This read gradient symmetry preserves the spin echo refocusing pulse relationships discussed in conjunction with FIGS. 2 and 3, above. However, the read gradient amplitude variations between the data acquisiton intervals and the refocusing pulses are selected to move the parasitic echoes away from the spin echoes. For example, during the increased amplitude fifth read gradient 98, parasitic echoes which follow the second refocusing pulse 54 are advanced, i.e. occur closer to the second refocusing pulse. The advancement tends to condense the parasitic echoes and expand the parasitic echo free regions.

As another alternative sequence, the refocusing pulse can be displaced in time from the center of the interval between the spin echoes or between the initial excitation pulse 50 and the first spin echo 62 of FIGURE 5. This allows a controlled expression of chemical shift differences between distinct materials in the subject. More specifically, the interval between the first refocusing pulse 52 and the second gradient pulse 92 can be increased by a duration in which the magnetizations of water and fat become 180° out of phase. This emphasizes boundary definition in the resultant image. Alternately, separate water and fat images might be recovered.

The invention has been described with reference to the preferred embodiments. Obviously, modifications and alterations will occur to others upon reading and understanding the preceding specification. It is intended that the invention be construed as including all such alterations and modifications in so far as they come within the scope of the appended claims or the equivalents thereof.

Having thus described the preferred embodiments, the invention is now claimed to be:

1. A method of magnetic resonance imaging comprising:
   positioning a subject to be imaged in an imaging region;
   creating a generally uniform main magnetic field in the imaging region; applying an asymmetric pulse sequence including:
   applying a radio frequency excitation pulse;
   creating a first read gradient in the main magnetic field subsequent to the excitation pulse;
   after the first read gradient, applying a first refocusing pulse a duration A after the excitation pulse such that a first spin echo occurs a duration 2A after the excitation pulse;
   creating a second read gradient subsequent to the first refocusing pulse and at least partially during the first spin echo;
   applying a second refocusing pulse a duration 2A+B after the excitation pulse such that a second spin echo occurs a duration 2A+2B after the excitation pulse;
   creating a third read gradient subsequent to the second refocusing pulse and at least partially during the second spin echo;
   imperfections in the excitation and refocusing pulses causing parasitic echoes which occur at a duration 3A+B after the excitation pulse, a duration 3A+2B after the excitation pulse, and a duration 4A+2B after the excitation pulse;
   acquiring data for a preselected data acquisition duration during each of the first and second spin echoes, the data acquisition duration being no longer than the shorter of durations A and B, the read gradients each having the same amplitude during the acquisition of data and having other amplitudes therebetween;
      the duration A and B being selected such that the duration 2A and the duration 2A+2B differ by at least the data acquisition duration from each of the durations 3A+B, 3A+2B, and 4A+2B, whereby the data is collected in the absence of parasitic echoes; and,
   reconstructing an image representation from the acquisition data.

2. The method as set forth in claim 1 wherein duration A is equal to the data collection duration and duration B is three times duration A.

3. The method as set forth in claim 1 further including:
   applying at least a third refocusing pulse a duration 2A+2B+C after the excitation pulse to cause a third spin-echo a duration 2A+2B+2C after the excitation pulse, the duration C being different from each of durations A and B; and,
   collecting data during the third spin echo for the data acquisition duration.

4. The method as set forth in claim 1 wherein the step of creating magnetic field gradients includes:
   after the radio frequency excitation pulse, applying a first gradient pulse;
   after the first refocusing pulse, applying a second gradient pulse;
   the first spin echo occuring when the amplitude of the second gradient pulse integrated with respect to time equals the amplitude of the first gradient pulse integrated over its duration;

applying a third gradient pulse which is continuous with the second gradient pulse and which commences at the first spin echo;

after the second refocusing pulse, applying a fourth gradient pulse;

the second spin echo occurs when the amplitude of the fourth gradient pulse integrated with respect to time equals the amplitude of the third gradient pulse integrated over its duration; and, continuing application of the fourth gradient during the acquisition of data during the second spin echo.

5. A method of magnetic resonance imaging comprising: p1 positioning an object to be imaged in an imaging region;

creating a generally uniform main magnetic field and magnetic field gradients in the imaging region;

applying an asymmetric multiple spin echo sequence including:

applying a 90° excitation pulse;

applying a first 180° refocusing pulse a duration A after the excitation pulse to cause a first spin echo a duration 2A after the excitation pulse;

acquiring data during the first spin echo;

applying a second 180° refocusing pulse a duration B after the first spin echo to cause a second spin echo a duration 2B after the first spin echo;

acquiring data during the second spin echo;

applying a third refocusing pulse a duration C after the second spin echo to cause a third spin echo a duration 2C after the second spin echo;

acquiring data during the third spin echo;

the duration A being different from the duration B and the duration C and the duration B being different from the duration C such that parasitic echoes attributable to imperfect refocusing pulses and the spin echoes are shifted in time relative to each other such that the parasitic echoes occur in between the spin echoes rather than concurrently therewith, whereby the parasitic echoes are separated from and do not degrade the acquired data; and, reconstructing the acquired data into a magnetic resonance image representation.

6. The method as set forth in claim 5 further including:

applying a fourth 180° refocusing pulse a duration D after the third spin echo to cause a fourth spin echo a duration 2D after the third spin echo;

acquiring data during the fourth spin echo;

the duration D being different from duration A, duration B, and duration C.

7. The method as set forth in claim 6 wherein the duration A is equal to twice the duration B, the duration C is equal to four times the duration B, and the duration D is equal to seven times the duration B.

8. The method as set forth in claim 6 wherein the duration B is three times the duration A, the duration C is twice the duration A, and the duration D is equal to six times the duration A.

9. The method as set forth in claim 5 wherein in each data acquisition step, the data is acquired for the same data acquisition interval, which data acquisition interval is shorter than each of durations A, B, and C.

10. The method as set forth in claim 9 wherein one of the durations A, B, and C is equal to the data acquisition interval, another is twice the data acquisition interval, and the other is at least three times the data acquisition interval.

11. A method of magnetic resonance imaging comprising:

positioning an object to be imaged in an imaging region;

creating a generally uniform main magnetic field and magnetic field gradients in the imaging region;

applying an asymmetric multiple spin echo sequence including;

applying a excitation pulse;

applying a first refocusing pulse a duration A after the excitation pulse to cause a first spin echo a duration 2A after the excitation pulse;

acquiring data during the first spin echo;

applying a second refocusing pulse a duration B after the first spin echo to cause a second spin echo a duration 2B after the first spin echo;

acquiring data during the second spin echo;

applying a third refocusing pulse a duration C after the second spin echo to cause a third spin echo a duration 2C after the second spin echo;

acquiring data during the third spin echo;

the duration A being different from the duration B and the duration C and the duration B being different from the duration C such that parasitic echoes attributable to imperfect refocusing pulses and the like occur between the spin echoes rather than concurrently therewith, whereby the parasitic echoes do not degrade the acquired data; and, reconstructing the acquired data into a magnetic resonance image representation;

the step of creating magnetic field gradients in the imaging region includes creating read gradients between the excitation pulse and the first refocusing pulse, between the first and second refocusing pulses, between the second and third refocusing pulses, and after the third refocusing pulse, the read gradients each having the same amplitude during the data acquisition steps and having other amplitudes at least in part therebetween.

12. A method of magnetic resonance imaging comprising:

positioning a subject in an image region having a generally uniform magnetic field passing therethrough;

applying a first radio frequency excitation pulse;

applying a first read gradient;

after the first read gradient, applying a first refocusing pulse;

after the first refocusing pulse, applying a second read gradient;

a first spin echo occurs when the amplitude of the second read gradient integrated over its duration equals the amplitude of the first read gradient integrated over its duration;

acquiring data during the first spin echo;

applying a third read gradient which is continuous with the second read gradient and commencing at the first spin echo;

after the third read gradient pulse, applying a second refocusing pulse;

after the second refocusing pulse, applying a fourth read gradient pulse;

a second spin echo occurs when the amplitude of the fourth read gradient integrated over its duration equals the amplitude of the third read gradient integrated over its duration;

continuing application of the fourth read gradient and acquiring data during the second spin echo;

parasitic echoes occur when the amplitude of the fourth read gradient integrated with respect to time equals one of:
(i) the amplitude of the first read gradient integrated over its duration,
(ii) the sum of the amplitude of the second and third read gradients integrated over their durations,
(iii) the sum of the amplitude of the first, second, and third read gradients integrated over their durations;

the amplitudes and durations of the first, second, third, and fourth read gradients being selected such that:
(i) the amplitude of the first read gradient pulse integrated over its duration,
(ii) the sum of the amplitude of the second and third read gradients integrated over their duration, and
(iii) the sum of the amplitude of the first, second, and third read gradient pulses integrated over their durations
are each different from the amplitude of the third read gradient pulse integrated over its duration, whereby the second spin echo is offset in time from the parasitic echoes; and,
reconstructing the data acquired during the spin echoes into an image representation.

13. The method as set forth in claim 12 wherein the data acquisition steps are each performed during a data acquisition interval of the same duration and wherein the read gradients are of the same, constant amplitude during the data acquisition intervals.

14. The method as set forth in claim 13 wherein at least two of the read gradients are mirror images of each other about an intervening refocusing pulse and have non-uniform amplitudes outside of the data acquisition intervals.

15. The method as set forth in claim 13 further including applying additional refocusing pulses and read gradients subsequent to the fourth read gradient.

16. The method as set forth in claim 13 wherein the fourth read gradient pulse integrated between a center of the second spin echo and a center of a nearest parasitic echo is at least as great as the fourth read gradient integrated over the data acquisition interval.

17. The method as set forth in claim 12 wherein the excitation pulse, spin echoes, and refocusing pulses have regular and symmetric intervals therebetween.

18. The method as set forth in claim 12 wherein at least one of the refocusing pulses is displaced in time from a center of an interval between (i) adjacent spin echoes and (ii) the radio frequency excitation pulse and the first spin echo.

19. A method of magnetic resonance spectroscopy comprising:
positioning a subject to be imaged in an imaging region;
creating a generally uniform main magnetic field and magnetic field gradients in the imaging region;
applying an asymmetric pulse sequence including;
applying a single radio frequency excitation pulse;
applying a single, first refocusing pulse a duration A after the excitation pulse such that a single, first spin echo occurs a duration 2A after the excitation pulse;
applying a single, second refocusing pulse a duration 2A+B after the excitation pulse such that a second spin echo occurs a duration 2A+2B after the excitation pulse;
imperfections in the excitation and refocusing pulses causing parasitic echoes which occur at a duration 3A+B after the excitation pulse, a duration 3A+2B after the excitation pulse, and a duration 4A+2B after the excitation pulse;
acquiring data for a single preselected data acquisition duration during each single non-parasitic spin echo which follows each refocusing pulse, the data acquisition duration being not longer than the shorter of durations A and B;
the duration A and B being selected such that the duration 2A and the duration 2A+2B differ by at least the data acquisition duration from each of the durations 3A+B, 3A+2B, and 4A+2B, whereby the data is collected in the absence of parasitic echoes.

20. A method of magnetic resonance spectroscopy comprising:
passing a generally uniform magnetic field through a subject;
applying a first radio frequency excitation pulse to the subject;
applying a first read gradient to the subject;
after the first read gradient, applying a first refocusing pulse to the subject;
after the first refocusing pulse, applying a second read gradient to the subject;
a first spin echo occurs when the amplitude of the second read gradient integrated over its duration equals the amplitude of the first read gradient integrated over its duration;
acquiring data during the first spin echo;
applying a third read gradient which is continuous with the second read gradient and commencing at the first spin echo;
after the third read gradient, applying a second refocusing pulse;
after the second refocusing pulse, applying a fourth read gradient;
a second spin echo occurs when the amplitude of the fourth read gradient integrated over its duration equals the amplitude of the third read gradient integrated over its duration;
continuing application of the fourth gradient pulse and acquiring data during the second spin echo;
parasitic echoes occur when the amplitude of the fourth read gradient integrated with respect to its time equals one of:
(i) the amplitude of the first read gradient integrated over its duration,
(ii) the sum of the amplitude of the second and third read gradients integrated over their durations,
(iii) the sum of the amplitude of the first, second, and third read gradients integrated over their durations;

the amplitudes and durations of the first, second, third, and fourth read gradients being selected such that:
(i) the amplitude of the first read gradient integrated over its duration,
(ii) the sum of the amplitude of the second and third read gradients integrated over their durations, and
(iii) the sum of the amplitude of the first, second, and third read gradients integrated over their durations are each different from the amplitude of the third read gradient integrated over its duration, whereby the second spin echo is offset in time from the parasitic echoes.

21. A magnetic resonance imaging apparatus comprising:

a magnet for generating a magnetic field generally longitudinally through an image region;

a radio frequency pulse applying means for applying radio frequency pulse sequences, each sequence including a radio frequence excitation pulse followed by at least two refocusing pulses;

a read gradient applying means for applying read gradients in the image region, the read gradients including:

a first read gradient which is applied between the excitation and first refocusing pulses;

a second read gradient which is applied after the first refocusing pulse and having a preselected amplitude during the occurence of a first spin echo, the first spin echo occurs when the amplitude of the second read gradient integrated with respect to time equals the amplitude of the first gradient integrated over its duration;

applying a third read gradient which is continuous with the second read gradient, commencing at the first spin echo, the second and third read gradients having a preselected amplitude during the first spin echo;

after the second refocusing pulse, applying a fourth read gradient pulse;

a second spin echo occurs when the amplitude of the fourth read gradient integrated with respect to time equals the amplitude of the third read gradient integrated over its duration;

the fourth read gradient and a fifth read gradient continuous therewith have said preselected amplitude during the second spin echo;

parasitic echoes occur when the amplitude of the fourth read gradient integrated with respect to time equals one of:
  (i) the amplitude of the first read gradient integrated over its duration,
  (ii) the sum of the amplitudes of the second and third read gradients over their durations,
  (iii) the sum of the amplitudes of the first, second, and third read gradients integrated over their durations;

the amplitudes of the durations of the first, second, third, and fourth read gradients being selected such that:
  (i) the amplitude of the first read gradient integrated over its duration,
  (ii) the sum of the amplitudes of the second and third read gradients over their durations, and
  (iii) the sum of the amplitudes of the first, second, and third read gradients integrated over their durations are each different from the amplitude of the third read gradient integrated over its duration such that the second spin echo is offset in time from the parasitic echoes;

data acquisition means for acquiring magnetic resonance data during each spin echo; and, image reconstructing means for reconstructing an image representation from the acquired data.

* * * * *